US012592362B2

(12) United States Patent
Kobayashi

(10) Patent No.: US 12,592,362 B2
(45) Date of Patent: Mar. 31, 2026

(54) PLASMA PROCESSING APPARATUS

(71) Applicant: Tokyo Electron Limited, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 45 days.

(21) Appl. No.: 18/662,420

(22) Filed: May 13, 2024

(65) Prior Publication Data

US 2024/0387144 A1 Nov. 21, 2024

(30) Foreign Application Priority Data

May 19, 2023 (JP) .................................. 2023-083199

(51) Int. Cl.
*H01J 37/32* (2006.01)

(52) U.S. Cl.
CPC ... *H01J 37/32183* (2013.01); *H01J 2237/332* (2013.01)

(58) Field of Classification Search
None
See application file for complete search history.

(56) References Cited

U.S. PATENT DOCUMENTS

| | | | | | |
|---|---|---|---|---|---|
| 6,884,635 | B2 * | 4/2005 | Parsons | ............. | H01J 37/32532 156/345.43 |
| 7,208,067 | B2 * | 4/2007 | Mitrovic | ........... | H01L 21/67248 156/345.28 |
| 11,557,461 | B2 * | 1/2023 | Bhutta | .............. | H01L 21/28556 |
| 11,589,474 | B2 * | 2/2023 | Criminale | ......... | H01L 21/67253 |
| 11,924,972 | B2 * | 3/2024 | Criminale | ......... | H01L 21/68742 |
| 12,131,889 | B2 * | 10/2024 | Kobayashi | ........ | H01J 37/32183 |
| 12,176,191 | B2 * | 12/2024 | Lafollett | ............. | H01J 37/3405 |
| 2004/0188021 | A1 * | 9/2004 | Mitrovic | ........... | H01L 21/67248 156/345.52 |
| 2008/0093024 | A1 * | 4/2008 | Abe | .................. | H01J 37/32091 156/345.44 |
| 2010/0018648 | A1 * | 1/2010 | Collins | ............. | H01J 37/32642 156/345.24 |
| 2013/0277333 | A1 * | 10/2013 | Misra | ................ | H01J 37/32183 216/61 |
| 2013/0284369 | A1 * | 10/2013 | Kobayashi | ........ | H01J 37/32091 118/712 |

(Continued)

FOREIGN PATENT DOCUMENTS

JP 2002-143672 A 5/2002

*Primary Examiner* — Srinivas Sathiraju
(74) *Attorney, Agent, or Firm* — Venjuris, P.C.

(57) ABSTRACT

A plasma processing apparatus includes a radio-frequency (RF) power supply; a pair of plasma electrodes, and a matcher disposed between the pair of plasma electrodes and the RF power supply. The matcher includes an RF feed line supplied with RF power from the RF power supply; a ground line; a first load line connected to one of the plasma electrodes; a second load line connected to the other of the plasma electrodes; an impedance matching circuit connected to the RF feed line, the first load line, the second load line, and the ground line, and including variable reactance elements; an RF sensor that is provided in the RF feed line and detects the RF power; a voltage sensor that detects a first peak value; and a matcher controller that controls the variable reactance elements by inputting detected values from the RF sensor and the voltage sensor.

9 Claims, 5 Drawing Sheets

(56) References Cited

U.S. PATENT DOCUMENTS

| | | | | | |
|---|---|---|---|---|---|
| 2014/0020837 A1* | 1/2014 | Nguyen | H05H 1/46 | | |
| | | | 156/345.48 | | |
| 2014/0020838 A1* | 1/2014 | Kenney | H01J 37/321 | | |
| | | | 156/345.48 | | |
| 2014/0020839 A1* | 1/2014 | Kenney | H01J 37/321 | | |
| | | | 156/345.48 | | |
| 2014/0021861 A1* | 1/2014 | Carducci | H01J 37/32183 | | |
| | | | 315/111.51 | | |
| 2014/0034239 A1* | 2/2014 | Yang | H01J 37/32082 | | |
| | | | 156/345.48 | | |
| 2014/0034612 A1* | 2/2014 | Yang | H01L 21/67109 | | |
| | | | 216/71 | | |
| 2014/0069584 A1* | 3/2014 | Yang | H01J 37/32082 | | |
| | | | 156/345.44 | | |
| 2016/0027616 A1* | 1/2016 | Ramaswamy | H01J 37/3211 | | |
| | | | 315/111.51 | | |
| 2016/0225587 A1* | 8/2016 | Inoue | H01J 37/32935 | | |
| 2017/0207068 A1* | 7/2017 | Nagami | H01J 37/32449 | | |
| 2018/0005857 A1* | 1/2018 | Zhang | H01J 37/321 | | |
| 2018/0211811 A1* | 7/2018 | Kenney | H05H 1/46 | | |
| 2020/0219698 A1* | 7/2020 | Ye | H01L 21/67167 | | |
| 2020/0373127 A1* | 11/2020 | Ulrich | C23C 16/50 | | |
| 2020/0393242 A1* | 12/2020 | Vishwanath | G01B 11/303 | | |
| 2021/0351005 A1* | 11/2021 | Kobayashi | C23C 16/45551 | | |
| 2021/0378100 A1* | 12/2021 | Criminale | H01L 22/34 | | |
| 2021/0378119 A1* | 12/2021 | Criminale | H05K 5/03 | | |
| 2021/0398778 A1* | 12/2021 | Kim | H01J 37/32183 | | |
| 2022/0122812 A1* | 4/2022 | Kobayashi | H01J 37/32458 | | |
| 2022/0293394 A1* | 9/2022 | Kobayashi | H01J 37/32183 | | |
| 2023/0053083 A1* | 2/2023 | Matsuura | C23C 16/345 | | |
| 2023/0129976 A1* | 4/2023 | Kobayashi | C23C 16/345 | | |
| | | | 438/792 | | |
| 2023/0235460 A1* | 7/2023 | Kobayashi | C23C 16/45546 | | |
| | | | 118/726 | | |
| 2023/0413446 A1* | 12/2023 | Criminale | H05K 1/183 | | |
| 2024/0023246 A1* | 1/2024 | Criminale | H01L 21/67259 | | |
| 2024/0079208 A1* | 3/2024 | Kobayashi | H01J 37/32834 | | |
| 2024/0183656 A1* | 6/2024 | Vishwanath | H01J 37/32495 | | |
| 2024/0290593 A1* | 8/2024 | Lafollett | C23C 14/3414 | | |
| 2024/0312763 A1* | 9/2024 | Kobayashi | H01J 37/321 | | |
| 2024/0355586 A1* | 10/2024 | Cui | H01J 37/32183 | | |
| 2024/0355587 A1* | 10/2024 | Cui | H01J 37/32183 | | |
| 2024/0387144 A1* | 11/2024 | Kobayashi | H01J 37/32174 | | |
| 2025/0079139 A1* | 3/2025 | Kobayashi | H01J 37/32522 | | |
| 2025/0149291 A1* | 5/2025 | Matsuura | H01J 37/32568 | | |

* cited by examiner

*FIG. 5*

| L1 | Vpp1 | PLASMA INTENSITY |
|----|------|------------------|
| SMALL | SMALL | HIGH |
| LARGE | LARGE | LOW |

PLASMA PROCESSING APPARATUS

CROSS-REFERENCE TO RELATED APPLICATIONS

This application is based on and claims priority from Japanese Patent Application No. 2023-083199 filed on May 19, 2023, with the Japan Patent Office, the disclosure of which is incorporated herein in its entirety by reference.

TECHNICAL FIELD

The present disclosure relates to a plasma processing apparatus.

BACKGROUND

Japanese Patent Laid-Open No. 2002-143672 discloses a plasma processing apparatus including a plurality of plasma processing chamber units, each of the plurality of plasma processing chamber units including a plasma processing chamber including an electrode to excite plasma; a radio-frequency (RF) power supply to supply RF power to the electrode; and a matching circuit that has an input terminal connected to the RF power supply, an output terminal connected to the electrode, and a ground potential portion provided between the input terminal and the output terminal, and matches impedances of the plasma processing chamber and the RF power supply.

SUMMARY

According to one aspect of the present disclosure, a plasma processing apparatus includes a radio-frequency (RF) power supply; a pair of plasma electrodes, and a matcher disposed between the pair of plasma electrodes and the RF power supply. The matcher includes an RF feed line through which RF power is supplied from the RF power supply; a ground line that is grounded; a first load line connected to one of the pair of plasma electrodes; a second load line connected to the other of the pair of plasma electrodes; an impedance matching circuit connected to the RF feed line, the first load line, the second load line, and the ground line, and including a plurality of variable reactance elements; an RF sensor provided in the RF feed line and configured to detect the RF power; a voltage sensor configured to detect a first peak value that is a peak value of a potential difference between the first load line and the ground line, and a matcher controller configured to control the plurality of variable reactance elements by inputting detected values from the RF sensor and the voltage sensor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a diagram illustrating an example of the relationship between a reactance capacity of a variable reactance element, a first peak value, and plasma intensity.

DETAILED DESCRIPTION

Figure 1:
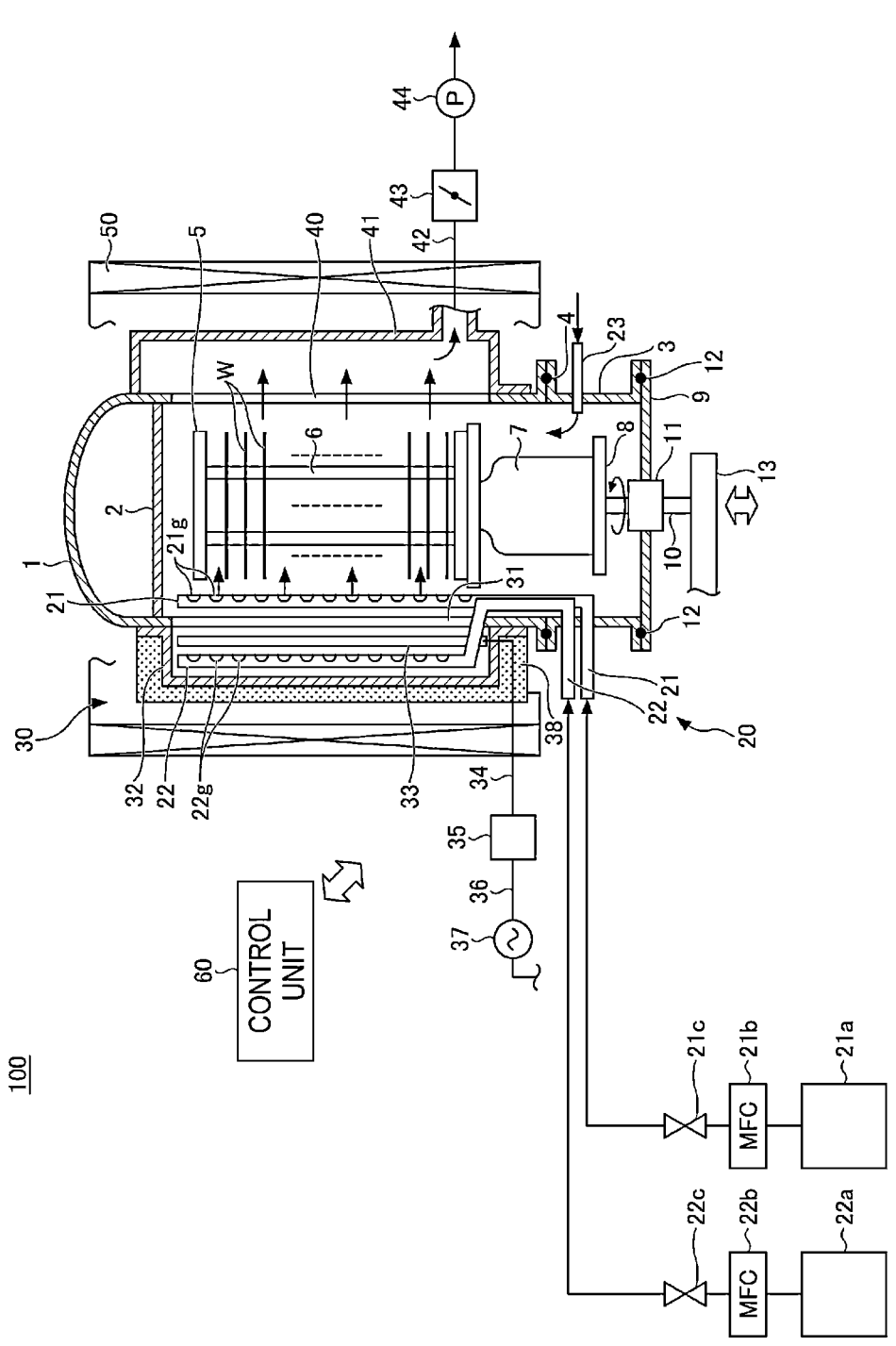
FIG. 1 is a schematic diagram illustrating an example of a configuration of a substrate processing apparatus.

In the following detailed description, reference is made to the accompanying drawings, which form a part hereof. The illustrative embodiments described in the detailed description, drawings, and claims are not meant to be limiting. Other embodiments may be utilized, and other modifications may be made without departing from the spirit or scope of the subject matter presented here.

Hereinafter, embodiments of the present disclosure will be described with reference to the drawings. In each drawing, the same components may be denoted by the same reference numerals, and duplicate descriptions may be omitted.

[Substrate Processing Apparatus]

An example of a substrate processing apparatus (plasma processing apparatus) 100 according to an embodiment of the present disclosure will be described with reference to FIG. 1. FIG. 1 is a schematic diagram illustrating an example of a configuration of the substrate processing apparatus 100. In the following description, the substrate processing apparatus 100 is exemplified as a film forming apparatus that forms a silicon nitride film on a substrate W through an atomic layer deposition (ALD) process, using plasma of a silicon-containing gas and a nitrogen-containing gas.

The substrate processing apparatus 100 has a cylindrical processing container 1 having a ceiling with an open bottom. The processing container 1 is entirely made of, for example, quartz. A ceiling plate 2 made of quartz is provided in the vicinity of an upper end of the processing container 1, and an area below the ceiling plate 2 is sealed. In the opening of the bottom of the processing container 1, a metal manifold 3 molded into a cylindrical shape is connected through a seal member 4 such as an O-ring.

The manifold 3 supports the bottom of the processing container 1, and a wafer boat 5 (substrate holder) where a plurality of (e.g., 25 to 150 sheets) of semiconductor wafers as substrates (hereinafter, referred to as "substrates W") is disposed in multiple stages is inserted into the processing container 1. Within the processing container 1 as described, the plurality of substrates W are accommodated substantially horizontally at intervals along a vertical direction. The wafer boat 5 is made of, for example, quartz. The wafer boat 5 has three rods 6 (two rods are illustrated in FIG. 1), and the plurality of substrates W are supported by grooves (not illustrated) formed in the rods 6.

The wafer boat 5 is disposed on a table 8 through a heat insulation tank 7 made of quartz. The table 8 is supported on a rotating shaft 10 penetrating a cover member 9 made of metal (stainless steel) that opens and closes the opening in the bottom of the manifold 3.

A magnetic fluid seal 11 is provided on a penetrating portion of the rotating shaft 10 and hermetically seals and rotatably supports the rotating shaft 10. In addition, seal members 12 are provided between a peripheral portion of the cover member 9 and the bottom of the manifold 3 to maintain hermeticity within the processing container 1.

The rotation shaft 10 is attached to a front end of an arm 13 supported by a lifting mechanism (not illustrated) such as, for example, a boat elevator, and the wafer boat 5 and the cover member 9 are raised and lowered as one body and inserted into and separated from the processing container 1. The table 8 may be fixed to the cover member 9, and the substrate W may be processed without rotating the wafer boat 5.

Additionally, the substrate processing apparatus 100 has a gas supply unit 20 (processing gas supply unit) that supplies a predetermined gas, such as a processing gas or a purge gas, into the processing container 1.

The gas supply unit 20 has gas supply pipes 21, 22, and 23. The gas supply pipe 21 is made of, for example, quartz. The gas supply pipe 21 penetrates a side wall of the manifold 3 inward, is bent upward, and extends vertically. In a vertical portion of the gas supply pipe 21, a plurality of gas holes 21g is formed at predetermined intervals along a length of the wafer boat 5 in the vertical direction, which corresponds to a wafer support range of the wafer boat 5. Each gas hole 21g ejects gas in a horizontal direction. The gas supply pipe 22 is made of, for example, quartz. The gas supply pipe 21 penetrates the side wall of the manifold 3 inward, is bent upward, and extends vertically. In a vertical portion of the gas supply pipe 22, a plurality of gas holes 22g is formed at predetermined intervals along the length of the wafer boat 5 in the vertical direction, which corresponds to the wafer support range of the wafer boat 5. Each gas hole 22g ejects gas in the horizontal direction. The gas supply pipe 23 is formed of, for example, quartz, and includes a short quartz pipe provided to penetrate the side wall of the manifold 3.

The vertical portion (vertical portion where the gas holes 21g are formed) of the gas supply pipe 21 is provided within the processing container 1. A processing gas (raw gas) is supplied to the gas supply pipe 21 from a gas supply source 21a through a gas pipe. The gas pipe is provided with a flow rate controller 21b and an opening/closing valve 21c. Accordingly, the processing gas from the gas supply source 21a is supplied into the processing container 1 through the gas pipe and the gas supply pipe 21. In addition, the processing gas supplied from the gas supply source 21a is, for example, a silicon-containing gas. The silicon-containing gas is, for example, dichlorosilane (DCS, $SiH_2Cl_2$).

The vertical portion of the gas supply pipe 22 (vertical portion where the gas holes 22g are formed) is provided in a plasma generation space to be described later. The processing gas (reaction gas, nitriding gas) is supplied from a gas supply source 22a to the gas supply pipe 22 through the gas pipe. The gas pipe is provided with a flow rate controller 22b and an opening/closing valve 22c. Accordingly, the processing gas from the gas supply source 22a is supplied to the plasma generation space through the gas pipe and the gas supply pipe 21, converted into plasma in the plasma generation space, and then, supplied into the processing container 1. The processing gas supplied from the gas supply source 22a is, for example, a nitrogen-containing gas. The nitrogen-containing gas is, for example, $NH_3$.

A purge gas is supplied to the gas supply pipe 23 from a purge gas supply source (not illustrated) through the gas pipe. The gas pipe (not illustrated) is provided with a flow rate controller (not illustrated) and an opening/closing valve (not illustrated). Accordingly, the purge gas from the purge gas supply source is supplied into the processing container 1 through the gas pipe and the gas supply pipe 23. The purge gas supplied from the purge gas supply source is, for example, an inert gas such as argon (Ar) or nitrogen ($N_2$). In addition, a case where the purge gas is supplied into the processing container 1 through the gas supply pipe 23 has been described, but the present disclosure is not limited thereto, and the purge gas may be supplied into the processing container 1 through any one of the gas supply pipes 21 and 22.

A plasma generation mechanism 30 is formed on a portion of a side wall of the processing container 1. The plasma generation mechanism 30 converts the processing gas from the gas supply source 22a into plasma.

The plasma generation mechanism 30 includes a plasma partition wall 32, a pair of plasma electrodes 33 (one of them is illustrated in FIG. 1), a feed line 34, a matcher 35, a coaxial cable 36, a radio-frequency (RF) power supply 37, and an insulating protective cover 38.

The plasma partition wall 32 is hermetically welded to an outer wall of the processing container 1. The plasma partition wall 32 is formed of, for example, quartz. The plasma partition wall 32 has a concave cross-section and covers an opening 31 formed in the side wall of the processing container 1. The opening 31 is formed to be thin and elongated in the vertical direction to cover all the substrates W supported on the wafer boat 5 in the vertical direction. The gas supply pipe 22 for ejecting the processing gas is disposed in an inner space defined by the plasma partition wall 32 and in communication with an inside of the processing container 1, that is, the plasma generation space. The gas supply pipe 21 for ejecting the processing gas is provided at a position close to the substrates W along an inner side wall of the processing container 1 in the outside of the plasma generation space.

The pair of plasma electrodes 33 (one of them is illustrated in FIG. 1) each has a thin and elongated shape and are disposed to face each other in the vertical direction on outer surfaces on both sides of the plasma partition wall 32. Each plasma electrode 33 is held by, for example, a holding portion (not illustrated) provided on a side surface of the plasma partition wall 32. The feed line 34 is connected to a bottom of each plasma electrode 33.

The feed line 34 electrically connects each plasma electrode 33 and the matcher 35. In the example illustrated, one end of the feed line 34 is connected to the bottom of each plasma electrode 33, and the other end thereof is connected to the matcher 35.

The matcher 35 is a device that has an impedance matching circuit 510 (see FIG. 2 described later) and performs impedance matching between the RF power supply 37 and the substrate processing apparatus 100 (the pair of plasma electrodes 33).

The coaxial cable 36 electrically connects the matcher 35 and the RF power supply 37.

The RF power supply 37 is connected to the bottom of each plasma electrode 33 through the coaxial cable 36, the matcher 35, and the feed line 34, and supplies RF power of, for example, 13.56 MHz, to the pair of plasma electrodes 33. As a result, the RF power is supplied within the plasma generation space defined by the plasma partition wall 32. The processing gas (nitrogen-containing gas) ejected from the gas supply pipe 22 is converted into plasma in the plasma generation space to which the RF power is supplied, and then, supplied to the inside of the processing container 1 through the opening 31.

The insulating protective cover 38 is attached to an outside of the plasma partition wall 32 so as to cover the plasma partition wall 32. A coolant passage (not illustrated) is provided in an inner portion of the insulating protective cover 38, and the plasma electrode 33 is cooled by flowing a coolant such as cooled nitrogen ($N_2$) gas through the coolant passage. In addition, a shield (not illustrated) may be provided between the plasma electrode 33 and the insulating protective cover 38 to cover the plasma electrode 33. The shield is formed of a good conductor such as, for example, metal, and is grounded.

An exhaust port 40 (exhaust portion) for evacuating the inside of the processing container 1 is provided on the side wall of the processing container 1 facing the opening 31. The exhaust port 40 is formed to be thin and elongated vertically, corresponding to the wafer boat 5. An exhaust port cover member 41 molded in a U-shape in cross-section is attached to a portion of the processing container 1 corresponding to the exhaust port 40 to cover the exhaust port 40. The exhaust port cover member 41 extends upward along the side wall of the processing container 1. An exhaust pipe 42 is connected to a lower portion of the exhaust port cover member 41 to evacuate the processing container 1 through the exhaust port 40. The exhaust pipe 42 is connected to a pressure control valve 43 for controlling the pressure within the processing container 1 and an exhaust device 44 including a vacuum pump, and the inside of the processing container 1 is evacuated by the exhaust device 44 through the exhaust pipe 42.

A heating mechanism 50 having a cylindrical shape is provided around the processing container 1. The heating mechanism 50 heats the processing container 1 and the substrates W inside the processing container 1. The heating mechanism 50 controls the temperature of the processing container 1 to reach a desired temperature. Accordingly, the substrate W in the processing container 1 is heated by radiant heat from a wall surface of the processing container 1.

In addition, the substrate processing apparatus 100 includes a control unit 60. The control unit 60 performs control of operations of each unit of the substrate processing apparatus 100 such as, for example, supply and stop of each gas by opening and closing opening and closing valves 21c and 22c, control of a gas flow rate by the flow rate controllers 21b and 22b, and control of exhaust by the exhaust device 44. In addition, the control unit 60 performs, for example, on/off control of RF power by the RF power supply 37 and control of the temperature of the processing container 1 and the substrates W inside the processing container 1 by the heating mechanism 50. Additionally, the control unit 60 controls the matcher 35.

The control unit 60 may be, for example, a computer. Additionally, computer programs that perform operations of each unit of the substrate processing apparatus 100 are stored in a storage medium. The storage medium may be, for example, a flexible disk, a compact disk, a hard disk, a flash memory, or DVD.

In the substrate processing apparatus 100 illustrated in FIG. 1, although a configuration in which plasma of the processing gas is generated in the plasma generating mechanism 30 provided on a side of the processing container 1, and activated processing gas is supplied to the substrates W in the processing container 1 has been described as an example, the present disclosure is not limited thereto. The substrate processing apparatus 100 may be configured to generate plasma of the processing gas within the processing container 1 and supply the activated processing gas to the substrates W within the processing container 1. In this case, the pair of plasma electrodes 33 are disposed to face each other with the processing container 1 interposed therebetween. Additionally, the wall surface of the processing container 1 serves as a plasma partition wall that partitions the plasma generation space.

[Substrate Processing Process of Substrate Processing Apparatus]

Next, an example of operations of the substrate processing apparatus 100 will be described. Here, descriptions will be made on a film forming process of forming a silicon nitride film on the substrate W by an ALD process, using plasma of a silicon-containing gas and a nitrogen-containing gas.

In the film forming process illustrated in one example, a process of supplying a raw material gas, a first purge process, a nitriding process, and a second purge process are repeated for a predetermined cycle to form a silicon nitride film on the substrate W. In each process, $N_2$ gas, which is a purge gas, is supplied all the time (continuously) from the gas supply pipe 23 during the film forming process.

The process of supplying the raw material gas is a process of supplying a silicon-containing gas into the processing container 1. In the process of supplying the raw material gas, the control unit 60 opens the opening and closing valve 21c to supply the silicon-containing gas into the processing container 1 from the gas supply source 21a through the gas supply pipe 21. Accordingly, the silicon-containing gas is adsorbed on a surface of the substrate W.

The first purge process is a process of purging excess silicon-containing gas in the processing container 1. In the first purge process, the control unit 60 closes the opening and closing valve 21c to stop the supply of the silicon-containing gas. As a result, the purge gas that is supplied from the gas supply pipe 23 all the time purges the excess silicon-containing gas in the processing container 1.

The nitriding process is a process of generating plasma of a nitrogen-containing gas and supplying active species (ions and radicals) containing nitrogen (N) into the processing container 1. In the nitriding process, the control unit 60 opens the opening and closing valve 22c to supply the nitrogen-containing gas to the plasma generation space within the plasma partition wall 32 from the gas supply source 22a through the gas supply pipe 22. Additionally, the control unit 60 controls the RF power supply 37 to supply RF power to the plasma electrode 33 and generate plasma in the plasma generation space within the plasma partition wall 32. That is, the control unit 60 generates active species including nitrogen (N) in the plasma generation space and supplies them into the processing container 1 from opening 31. Accordingly, the silicon-containing gas adsorbed on the surface of the substrate W is nitrided, thereby forming a silicon nitride film on the surface of the substrate W.

The second purge process is a process of purging excess nitrogen-containing gas in the processing container 1. In the second purge process, the control unit 60 closes the opening and closing valve 22c to stop supply of the nitrogen-containing gas. Further, the control unit 60 controls the RF power supply 37 to stop the supply of the RF power and stop the generation of plasma. Accordingly, the purge gas that is supplied from the gas supply pipe 23 all the time purges the excess nitrogen-containing gas in the processing container 1.

The process of supplying the raw material gas, the first purge process, the nitriding process, and the second purge process described above are performed as one cycle, and are repeated for a predetermined number of cycles to form a silicon nitride film with a desired film thickness on the substrate W.

The film forming process may include a reforming process to improve uniformity of an in-plane film thickness of the silicon nitride film and film quality of the silicon nitride film.

The reforming process is a process of generating plasma of a reformed gas (e.g., hydrogen gas) and supplying active species (ions and radicals) of the reformed gas into the processing container 1. In the reforming process, the control unit 60 supplies reformed gas from a reformed gas source (not illustrated) to the plasma generation space within the plasma partition wall 32 through the gas supply pipe 22. The reformed gas is, for example, hydrogen ($H_2$) gas. Additionally, the control unit 60 controls the RF power supply 37 to supply RF power to the plasma electrode 33 and generate plasma in the plasma generation space within the plasma partition wall 32. That is, the control unit 60 generates active species of the reformed gas in the plasma generation space and supplies them into the processing container 1 from the opening 31. Accordingly, the silicon nitride film formed on the surface of the substrate W is reformed.

The reforming process has been described as an example of supplying a reformed gas activated using plasma into the processing container 1, but it is not limited thereto. The reforming process may be configured to supply a reformed gas into the processing container 1.

In this manner, the plasma generated in the plasma generation space is used for a nitriding process and a reforming process.

Here, the substrate processing apparatus 100 has machine differences due to physical tolerances or installation errors. For example, the substrate processing apparatus 100 has machine differences in a distance between the pair of plasma electrodes 33, a distance from one plasma electrodes 33 on one side (plasma electrode 331 to be described later in FIG. 2) to the heating mechanism 50 grounded (or grounded shield), a distance from the other plasma electrodes 33 on the other side (plasma electrode 332 to be described later in FIG. 2) to the grounded heating mechanism 50 (or the grounded shield), and a thickness of the plasma partition wall 32 disposed between the pair of plasma electrodes 33.

These machine differences may affect the state of plasma 39 (see FIG. 2 to be described later) generated in the plasma generation space within the plasma partition wall 32. Additionally, depending on the state of the generated plasma 39, process results (e.g., a film thickness and film quality) of the film (silicon nitride film) formed on the substrate W may be affected.

For this reason, the substrate processing apparatus 100 capable of adjusting the machine difference is required. Specifically, the substrate processing apparatus 100 capable of adjusting the influence of process results due to the machine differences of the substrate processing apparatus 100, by the matcher 35, is required.

[Matcher]

Figure 2:
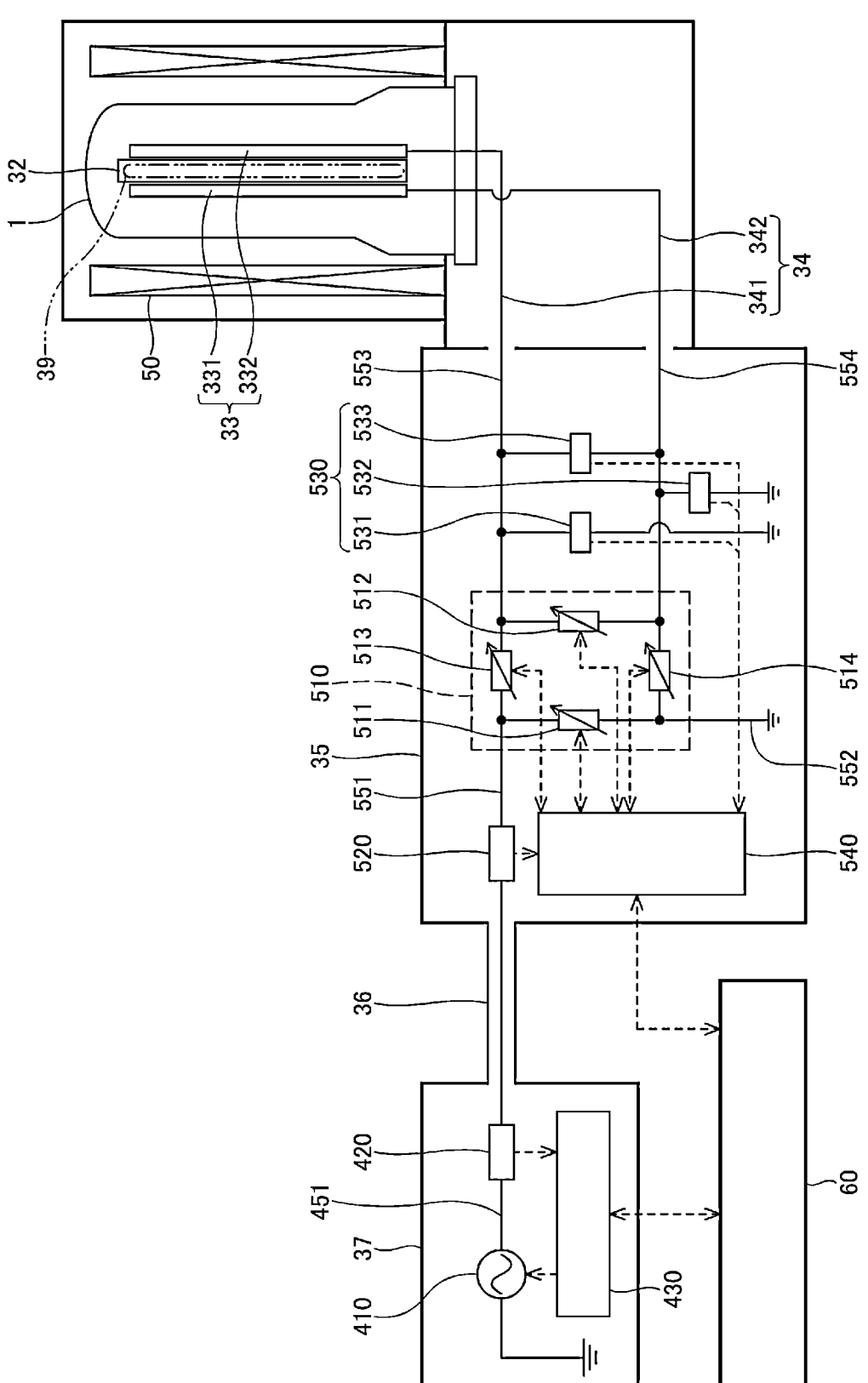
FIG. 2 is a circuit diagram illustrating an example of a circuit that supplies radio-frequency (RF) power to a plasma electrode.

Next, the matcher 35 will be further explained with reference to FIG. 2. FIG. 2 is a circuit diagram illustrating an example of a circuit that supplies RF power to the plasma electrodes 33. In FIG. 2, signal flows are illustrated by broken arrows.

The plasma electrodes 33 have the plasma electrode 331 on one side and the plasma electrode 332 on the other side. A pair of the plasma electrodes 331 and 332 are disposed to face each other on the outside of the plasma partition wall 32. Within the plasma partition wall 32, the plasma generation space for generating the plasma 39 is formed.

The RF power supply 37 includes a power source 410, an RF sensor 420, and a power supply control unit 430. In addition, the RF power supply 37 includes an RF line 451.

The RF power is output from the power source 410 to the RF line 451.

The power source 410 includes, for example, an RF oscillator and an amplifier. The RF oscillator is an oscillator that generates a sinusoidal wave or fundamental wave at a predetermined frequency (e.g., 13.56 MHz). The amplifier is an amplifier that amplifies the power of the sinusoidal wave or fundamental wave output from the RF oscillator with a variably controllable gain or amplification factor. The power source 410 is controlled by the power supply control unit 430.

The RF sensor 420 is provided on the RF line 451 and detects RF power output from the RF power supply 37. In addition, the RF sensor 420 is provided with a directional coupler on the RF line 451. The RF sensor 420 detects power PF1 of a traveling wave propagating on the RF line 451 in a forward direction, that is, from the RF power supply 37 to the matcher 35. Additionally, the RF sensor 420 detects power RF1 of a reflected wave propagating on the RF line 451 in a reverse direction, that is, from the matcher 35 to the RF power supply 37. In addition, the RF sensor 420 outputs a detected result to the power supply control unit 430.

The power supply control unit 430 controls the power source 410 according to a control signal from the control unit 60. Additionally, the power supply control unit 430 controls the power source 410 according to the detected result detected by the RF sensor 420. Furthermore, the power supply control unit 430 outputs the detected result detected by the RF sensor 420 to the control unit 60.

The coaxial cable 36 connects the RF power supply 37 and the matcher 35. Specifically, an internal conductor (core wire) of the coaxial cable 36 connects the RF line 451 of the RF power supply 37 and an RF feed line 551 of the matcher 35. Additionally, an external conductor (shield) of the coaxial cable 36 is grounded.

The matcher 35 includes the impedance matching circuit 510, an RF sensor 520, a voltage sensor 530, and a matcher control unit 540. In addition, the matcher 35 includes the RF feed line 551, a ground line 552, a first load line 553, and a second load line 554.

The RF feed line 551 is connected to the RF line 451 of the RF power supply 37 through the coaxial cable 36. That is, the RF feed line 551 is a line through which RF power is supplied from the RF power supply 37.

The ground line 552 is a line that is grounded.

The first load line 553 is connected to the plasma electrode 331 on one side through a feed line 341. The second load line 554 is connected to the plasma electrode 332 on the other side through a feed line 342.

The impedance matching circuit 510 has a plurality of variable reactance elements 511 to 514. In addition, the impedance matching circuit 510 is connected to the RF feed line 551, the ground line 552, the first load line 553, and the second load line 554.

The first variable reactance element 511 is disposed between the RF feed line 551 and the ground line 552. The second variable reactance element 512 is disposed between the first load line 553 and the second load line 554. The third variable reactance element 513 is disposed between the RF feed line 551 and the first load line 553. The fourth variable reactance element 514 is disposed between the ground line 552 and the second load line 554.

The first variable reactance element 511 may be a variable capacitor with adjustable capacitance, a variable inductor with adjustable inductance, or a combination of the variable capacitor and the variable inductor. In addition, the first variable reactance element 511 may include at least one of a fixed capacitor (e.g., parasitic capacitance), a fixed inductor (e.g., parasitic inductance), and a fixed resistor (e.g., parasitic resistance). The capacitance and/or inductance of the first variable reactance element 511 is controlled by the matcher control unit 540.

The second variable reactance element 512 may be a variable capacitor with adjustable capacitance, a variable inductor with adjustable inductance, or a combination of the variable capacitor and the variable inductor. Additionally, the second variable reactance element 512 may include at least one of a fixed capacitor (e.g., parasitic capacitance), a fixed inductor (e.g., parasitic inductance), and a fixed resistor (e.g., parasitic resistance). The capacitance and/or inductance of the second variable reactance element 512 is controlled by the matcher control unit 540.

The third variable reactance element 513 may be a variable capacitor with adjustable capacitance, a variable inductor with adjustable inductance, or a combination of the variable capacitor and the variable inductor. Additionally, the third variable reactance element 513 may include at least one of a fixed capacitor (e.g., parasitic capacitance), a fixed inductor (e.g., parasitic inductance), and a fixed resistor (e.g., parasitic resistance). The capacitance and/or inductance of the third variable reactance element 513 is controlled by the matcher control unit 540.

The fourth variable reactance element 514 may be a variable capacitor with adjustable capacitance, a variable inductor with adjustable inductance, or a combination of the variable capacitor and the variable inductor. Additionally, the fourth variable reactance element 514 may include at least one of a fixed capacitor (e.g., parasitic capacitance), a fixed inductor (e.g., parasitic inductance), and a fixed resistor (e.g., parasitic resistance). The capacitance and/or inductance of the fourth variable reactance element 514 is controlled by the matcher control unit 540.

The RF sensor 520 is provided on the RF feed line 551 and detects the RF power supplied from the RF power supply 37. In addition, the RF sensor 520 is provided with a directional coupler on the RF feed line 551. The RF sensor 520 detects power PF2 of a traveling wave propagating on the RF feed line 551 in a forward direction, that is, from the RF power supply 37 to the matcher 35. Additionally, the RF sensor 520 detects power RF2 of a reflected wave propagating on the RF feed line 551 in a reverse direction, that is, from the matcher 35 to the RF power supply 37. The RF sensor 520 outputs a detected result to the matcher control unit 540.

The voltage sensor 530 includes a first voltage sensor 531, a second voltage sensor 532, and a third voltage sensor 533.

The first voltage sensor 531 detects a potential difference between the first load line 553 and the ground line 552 and detects a peak value of the potential difference. Hereinafter, the peak value detected by the first voltage sensor 531 is also referred to as a first peak value Vpp1. The first voltage sensor 531 outputs a detected result to the matcher control unit 540.

The second voltage sensor 532 detects a potential difference between the second load line 554 and the ground line 552 and detects a peak value of the potential difference. Hereinafter, the peak value detected by the second voltage sensor 532 is also referred to as a second peak value Vpp2. The second voltage sensor 532 outputs a detected result to the matcher control unit 540.

The third voltage sensor 533 detects a potential difference between the first load line 553 and the second load line 554 and detects a peak value of the potential difference. Hereinafter, the peak value detected by the third voltage sensor

533 is also referred to as a third peak value Vpp3. The third voltage sensor 533 outputs a detected result to the matcher control unit 540.

The voltage sensor 530 illustrated in FIG. 2 has been described as including three voltage sensors: the first voltage sensor 531, the second voltage sensor 532, and the third voltage sensor 533, but it is not limited thereto. The third voltage sensor 533 may be omitted. In this case, the matcher control unit 540 calculates a potential difference between the first load line 553 and the second load line 554 from a difference between the potential difference detected by the first voltage sensor 531 and the potential difference detected by the second voltage sensor 532, and may calculate the third peak value Vpp3. Similarly, the voltage sensor 530 may be configured to include at least two of the first voltage sensor 531, the second voltage sensor 532, and the third voltage sensor 533.

The matcher control unit 540 controls the variable reactance elements 511 to 514 of the impedance matching circuit 510 according to the control signal from the control unit 60. Further, the matcher control unit 540 controls the variable reactance elements 511 to 514 of the impedance matching circuit 510 according to detected results detected by the RF sensor 520 and the voltage sensor 530 (first voltage sensor 531, second voltage sensor 532, and third voltage sensor 533). In addition, the matcher control unit 540 outputs the detected results detected by the RF sensor 520 and the voltage sensor 530 to the control unit 60.

The feed line 34 includes the feed line 341 and the feed line 342. The feed line 341 connects the first load line 553 of the matcher 35 with the plasma electrode 331. The feed line 342 connects the second load line 554 of the matcher 35 with the plasma electrode 332.

With this configuration, the matcher 35 is configured such that the capacitance and/or inductance of the variable reactance elements 511 to 514 may be controlled by the matcher control unit 540.

For this reason, the matcher control unit 540 controls the capacitance and/or inductance of the variable reactance elements 511 to 514 such that the power RF2 of the reflected wave is reduced (approaches zero) based on the detected result of the RF sensor 520. In other words, the matcher control unit 540 controls the capacitance and/or inductance of the variable reactance elements 511 to 514 such that impedance of a load side including the impedance matching circuit 510 becomes a predetermined impedance.

Furthermore, the matcher control unit 540 controls the capacitance and/or inductance of the variable reactance elements 511 to 514 such that the first peak value Vpp1 (i.e., the peak value of the plasma electrode 331) becomes a predetermined set value based on the detected result of the voltage sensor 530.

In addition, the matcher control unit 540 controls the capacitance and/or inductance of the variable reactance elements 511 to 514 such that the second peak value Vpp2 (i.e., the peak value of the plasma electrode 332) becomes a predetermined set value based on the detected result of the voltage sensor 530.

In other words, the matcher 35 illustrated in FIG. 2 may promote impedance matching and adjust the peak value (first peak value Vpp1) of the plasma electrode 331 and the peak value (second peak value Vpp2) of the plasma electrode 332. Furthermore, a peak value (third peak Vpp3) of voltage between the plasma electrodes 331 and 332 may be adjusted. Accordingly, a difference in the state of the plasma 39 due to the machine difference of the substrate processing apparatus 100 may be suppressed. Also, the influence of the process result due to the machine difference of the substrate processing apparatus 100 may be reduced by the matcher 35.

Figure 3:
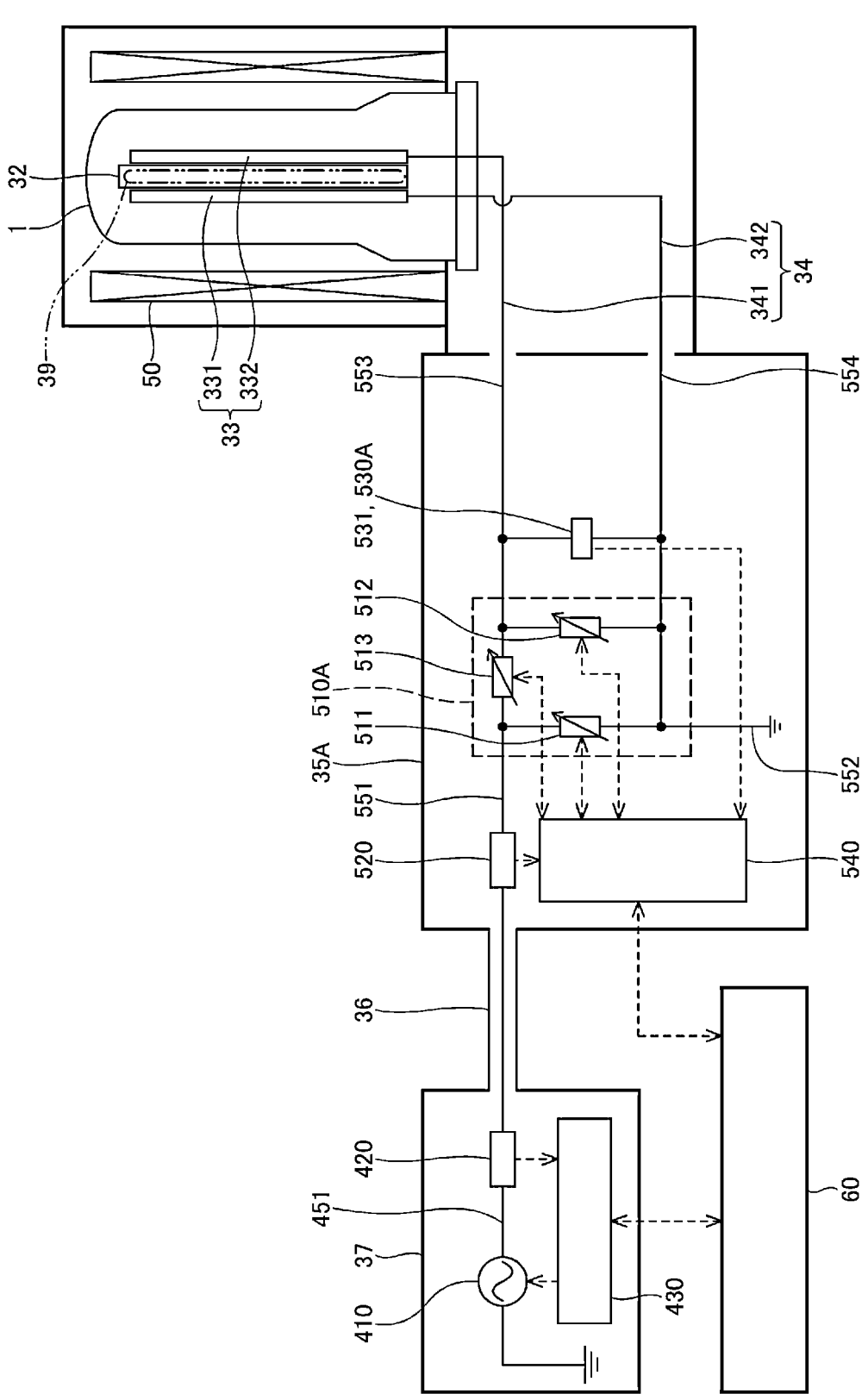
FIG. 3 is a circuit diagram illustrating another example of a circuit that supplies RF power to a plasma electrode.

A configuration of the matcher 35 is not limited to that illustrated in FIG. 2. Another matcher 35A will be further described with reference to FIG. 3. FIG. 3 is a circuit diagram illustrating another example of a circuit that supplies RF power to the plasma electrode 33. In FIG. 3, signal flows are illustrated by dashed arrows.

The circuit diagram of the substrate processing apparatus 100 illustrated in FIG. 3 differs from the circuit diagram of the substrate processing apparatus 100 illustrated in FIG. 2, in terms of the matcher 35A. Other configurations thereof are the same, and redundant descriptions will be omitted.

The matcher 35A includes an impedance matching circuit 510A, an RF sensor 520, a voltage sensor 530, and a matcher control unit 540. The matcher 35A also includes an RF supply line 551, a ground line 552, a first load line 553, and a second load line 554.

The RF feed line 551 is connected to the RF line 451 of the RF power supply 37 through the coaxial cable 36. That is, the RF feed line 551 is a line through which RF power is supplied from the RF power supply 37.

The ground line 552 is a line that is grounded.

The first load line 553 is connected to the plasma electrode 331 on one side through a feed line 341. The second load line 554 is connected to the plasma electrode 332 on the other side through a feed line 342.

The impedance matching circuit 510A has a plurality of variable reactance elements 511 to 514. The impedance matching circuit 510A is connected to the RF feed line 551, the ground line 552, the first load line 553, and the second load line 554.

The first variable reactance element 511 is disposed between the RF feed line 551 and the ground line 552. The second variable reactance element 512 is disposed between the first load line 553 and the second load line 554. The third variable reactance element 513 is disposed between the RF feed line 551 and the first load line 553. In addition, the ground line 552 and the second load line 554 are connected to each other.

The first variable reactance element 511 may be a variable capacitor with adjustable capacitance, a variable inductor with adjustable inductance, or a combination of the variable capacitor and the variable inductor. Additionally, the first variable reactance element 511 may include at least one of a fixed capacitor (e.g., parasitic capacitance), a fixed inductor (e.g., parasitic inductance), and a fixed resistor (e.g., parasitic resistance). The capacitance and/or inductance of the first variable reactance element 511 is controlled by the matcher control unit 540.

The second variable reactance element 512 may be a variable capacitor with adjustable capacitance, a variable inductor with adjustable inductance, or a combination of the variable capacitor and the variable inductor. Additionally, the second variable reactance element 512 may include at least one of a fixed capacitor (e.g., parasitic capacitance), a fixed inductor (e.g., parasitic inductance), and a fixed resistor (e.g., parasitic resistance). The capacitance and/or inductance of the second variable reactance element 512 is controlled by the matcher control unit 540.

The third variable reactance element 513 may be a variable capacitor with adjustable capacitance, a variable inductor with adjustable inductance, or a combination of the variable capacitor and the variable inductor. Further, the third variable reactance element 513 may include at least one of a fixed capacitor (e.g., parasitic capacitance), a fixed inductor (e.g., parasitic inductance), and a fixed resistor (e.g., parasitic resistance). The capacitance and/or inductance of the third variable reactance element 513 is controlled by the matcher control unit 540.

The RF sensor 520 is provided on the RF feed line 551 and detects RF power supplied from the RF power supply 37. Additionally, the RF sensor 520 is provided with a directional coupler on the RF feed line 551. The RF sensor 520 detects power PF2 of a traveling wave propagating on the RF supply line 551 in a forward direction, i.e., from the RF power supply 37 to the matcher 35A. Further, the RF sensor 520 detects power RF2 of a reflected wave propagating on the RF feed line 551 in a reverse direction, i.e., from the matcher 35A to the RF power supply 37. The RF sensor 520 outputs a detected result to the matcher control unit 540.

A voltage sensor 530A includes a first voltage sensor 531.

The first voltage sensor 531 detects a potential difference between the first load line 553 and the ground line 552 and detects a peak value of the potential difference. Hereinafter, the peak value detected by the first voltage sensor 531 is also referred to as a first peak value Vpp1. The first voltage sensor 531 outputs a detected result to the matcher control unit 540.

In a configuration of the circuit diagram of the substrate processing apparatus 100 illustrated in FIG. 3, the second load line 554 is connected to the ground line 552. For this reason, a second peak value Vpp2 is zero, and a third peak value Vpp3 is equal to the first peak value Vpp1.

The matcher control unit 540 controls the variable reactance elements 511 to 513 of the impedance matching circuit 510A according to a control signal from the control unit 60. In addition, the matcher control unit 540 controls the variable reactance elements 511 to 513 of the impedance matching circuit 510A according to the detected results detected by the RF sensor 520 and the voltage sensor 530A (the first voltage sensor 531). Furthermore, the matcher control unit 540 outputs detected results detected by the RF sensor 520 and the voltage sensor 530A to the control unit 60.

With this configuration, the matcher 35A is configured such that the capacitance and/or inductance of the variable reactance elements 511 to 513 may be controlled by the matcher control unit 540.

For this reason, the matcher control unit 540 controls the capacitance and/or inductance of the variable reactance elements 511-513 such that the power RF2 of the reflected wave is reduced (approaches zero) based on the detected result of the RF sensor 520. In other words, the matcher control unit 540 controls the capacitance and/or inductance of the variable reactance elements 511 to 513 such that impedance of a load side including the impedance matching circuit 510A becomes a predetermined impedance.

Furthermore, the matcher control unit 540 controls the capacitance and/or inductance of the variable reactance elements 511 to 513 such that the first peak value Vpp1 (i.e., the peak value of the plasma electrode 331 on the one side) becomes a predetermined set value based on the detected result of the voltage sensor 530A.

In other words, the matcher 35A illustrated in FIG. 3 may promote impedance matching and adjust a peak value (first peak value Vpp1) of voltage between the plasma electrodes 331 and 332. Accordingly, a difference in the state of the plasma 39 due to the machine difference of the substrate processing apparatus 100 may be suppressed. Furthermore, the influence of the process result due to the machine difference of the substrate processing apparatus 100 may be reduced by the matcher 35A.

[Impedance Matching Circuit]

Figure 4:
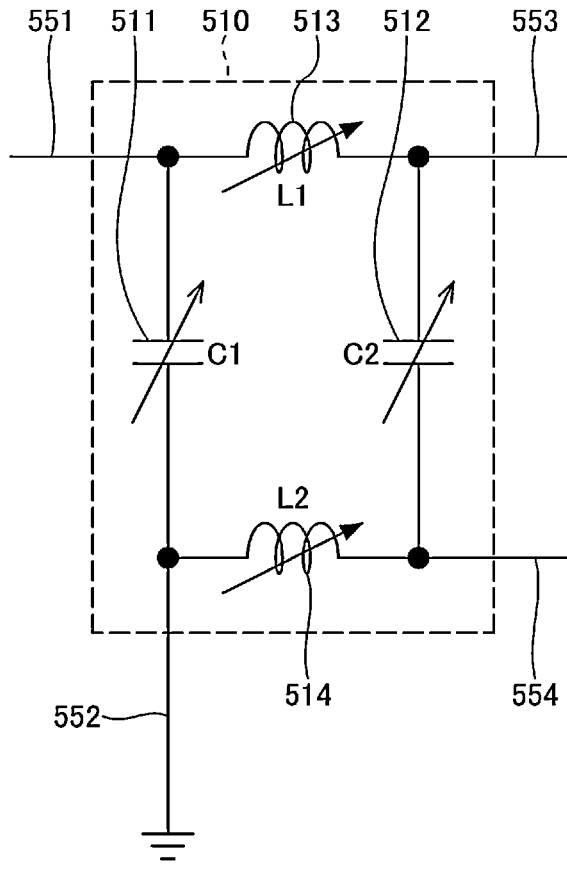
FIG. 4 is a circuit diagram illustrating an example of an impedance matching circuit.

Next, an example of the impedance matching circuit 510 will be described with reference to FIG. 4. FIG. 4 is a circuit diagram illustrating an example of the impedance matching circuit 510.

In the example illustrated in FIG. 4, the first variable reactance element 511 is a variable capacitor having an adjustable capacitance C1. The second variable reactance element 512 is a variable capacitor having an adjustable capacitance C2. The third variable reactance element 513 is a variable inductor having an adjustable inductance L1. The fourth variable reactance element 514 is a variable inductor having an adjustable inductance L2.

FIG. 5 is a diagram illustrating an example of the relationship between the inductance L1 of the third variable reactance element 513, the first peak value Vpp1, and plasma intensity.

Here, the matcher control unit 540 changes the inductance L1 of the third variable reactance element 513 and controls the other variable reactance elements 511, 512, and 514 to promote impedance matching.

As illustrated in FIG. 5, as the inductance L1 of the third variable reactance element 513 increases from "small" to "large," the first peak value Vpp1 increases from "small" to "large." Additionally, as the inductance L1 of the third variable reactance element 513 increases from "small" to "large," the plasma intensity decreases from "high" to "low."

In this manner, the matcher 35 may control the first peak value Vpp1 and the plasma intensity by controlling each of the variable reactance element 511 to 514 of the impedance matching circuit 510.

According to one aspect, it is possible to provide a plasma processing apparatus capable of adjusting machine differences.

From the foregoing content, it will be appreciated that various embodiments of the present disclosure have been described herein for purposes of illustration, and that various modifications can be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a radio-frequency (RF) power supply;
a pair of plasma electrodes; and
a matching box disposed between the pair of plasma electrodes and the RF power supply,
wherein the matching box includes:
   an RF feed line through which RF power is supplied from the RF power supply,
a ground line that is grounded,
a first load line connected to one of the pair of plasma electrodes,
   a second load line connected to a remaining one of the pair of plasma electrodes;
   an impedance matching circuit connected to the RF feed line, the first load line, the second load line, and the ground line, and including a plurality of variable reactance elements;
   an RF sensor provided in the RF feed line and configured to detect the RF power;
   a voltage sensor including a peak detection circuit and configured to detect a peak value of a potential difference waveform that is a peak value of a potential difference, the peak detection circuit including a plurality of sensors respectively connected to the first load line, the second load line and the ground line, and
   a matching box controller configured to control the plurality of variable reactance elements by inputting detected values from the RF sensor and the voltage sensor.

2. The plasma processing apparatus according to claim 1, wherein the impedance matching circuit includes:
   a first variable reactance element disposed between the RF feed line and the ground line;
   a second variable reactance element disposed between the RF feed line and the first load line;
   a third variable reactance element disposed between the first load line and the second load line; and
   a fourth variable reactance element disposed between the second load line and the ground line.

3. The plasma processing apparatus according to claim 2, wherein the first variable reactance element and the second variable reactance element are variable capacitors, and
   the third variable reactance element and the fourth variable reactance element are variable inductors.

4. The plasma processing apparatus according to claim 1, wherein the peak detection circuit includes:
   a first voltage sensor configured to detect a first peak value that is a peak value of a potential difference waveform between the first load line and the ground line, and
   a second voltage sensor configured to detect a second peak value that is a peak value of a potential difference waveform between the second load line and the ground line.

5. The plasma processing apparatus according to claim 4, wherein the peak detection circuit further includes:
   a third voltage sensor configured to detect a third peak value that is a peak value of a potential difference waveform between the first load line and the second load line.

6. The plasma processing apparatus according to claim 1, wherein the impedance matching circuit includes:
   a first variable reactance element disposed between the RF feed line and the ground line;
   a second variable reactance element disposed between the RF feed line and the first load line; and
   a third variable reactance element disposed between the first load line and the second load line, and
   wherein the second load line and the ground line are connected.

7. The plasma processing apparatus according to claim 1, wherein each of the plurality of the variable reactance elements is one of a variable capacitor having an adjustable capacitance and a variable inductor having an adjustable inductance.

8. The plasma processing apparatus according to claim 1, wherein the pair of plasma electrodes are disposed to face each other, and
   wherein a plasma partition wall is provided between the pair of plasma electrodes to partition a plasma generation space.

9. The plasma processing apparatus according to claim 1, wherein the matching box controller is configured to control the plurality of variable reactance elements such that the detected peak value becomes a predetermined set value.

* * * * *